United States Patent [19]

Fletcher et al.

[11] Patent Number: 4,813,115

[45] Date of Patent: Mar. 21, 1989

[54] METHOD FOR TESTING AND REPAIRING SYNCHRONOUS MOTORS

[75] Inventors: James E. Fletcher, Gonzales; Eric C. Jackson; Michael McAnelly, both of Baton Rouge, all of La.

[73] Assignee: Triad Chemical Corporation, Donaldsonville, La.

[21] Appl. No.: 124,299

[22] Filed: Nov. 23, 1987

Related U.S. Application Data

[62] Division of Ser. No. 519,718, Aug. 2, 1983, Pat. No. 4,739,256.

[51] Int. Cl.$^4$ ............................................. H02K 15/14
[52] U.S. Cl. .................................... 29/596; 29/402.08; 310/42; 310/68 A; 310/71; 324/158 MG
[58] Field of Search ................. 29/596, 402.08, 402.03; 324/158 MG, 158 R, 73 R; 310/42, 68 R, 68 A, 71

[56] References Cited

FOREIGN PATENT DOCUMENTS

1258512 1/1968 Fed. Rep. of Germany ...... 324/158 MG

Primary Examiner—Carl E. Hall
Attorney, Agent, or Firm—Oblon, Fisher, Spivak, McClelland & Maier

[57] ABSTRACT

An apparatus for testing a synchronizing control circuit for any assembly relying upon detecting the relative closeness of one voltage of varying frequency to another voltage of different varying frequency, comprising a test circuit including a first circuit for determining the frequency at which the control circuit operates and a second circuit for determining the operational response of an individual control circuit assembly. A test selection circuit is used to select the desired portion of the test circuit. The apparatus simulates the frequency difference for a frequency comparator circuit of multi generator installations and the operation of a starting synchronous motor, which enables all the components of the comparator control circuit and the components of the synchronous motor exciter control circuit to be checked without actual operation of the prime movers that generate the voltage of varying frequency. Further, the synchronous motor exciter control circuit mounting assembly is made replaceable to facilitate faster and accurate component repairs.

5 Claims, 6 Drawing Sheets

METHOD FOR TESTING AND REPAIRING SYNCHRONOUS MOTORS

This is a division of application Ser. No. 06/519,718, filed Aug. 2, 1983 now U.S. Pat. No. 4,739,256.

BACKGROUND OF THE INVENTION

1. Field of the Invention

The present invention relates to a method and apparatus for repairing and testing synchronous motors and to a synchronous motor exciter control circuit tester hereinafter referred to as synch circuit tester which will simulate a synchronous motor approaching, reaching, and passing the point at which it locks onto its particular synchronous speed.

2. Description of the Prior Art

Figure 4:
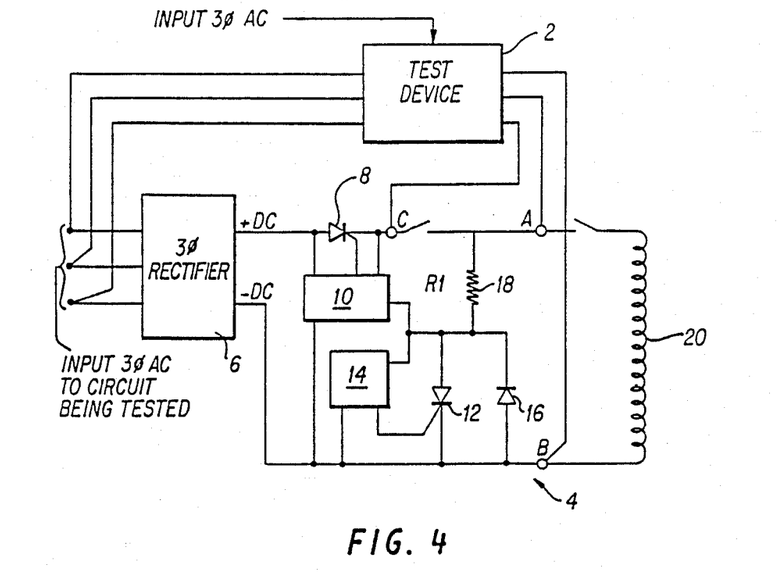
FIG. 4 is a schematic diagram showing the present invention connected to a conventional synchronous motor exciter control circuit.

Many synchronous motors, especially those using brushless excitation are equipped with exciter control circuits which are used to develop and control the DC power necessary to realize synchronous operation. One such exciter control circuit as shown in FIG. 4 includes a three-phase rectifier connected to a three-phase power source (which is rectified to provide DC voltage), a pair of silicon controlled rectifiers 8 and 12 with respective control assembly circuits 10 and 14, a diode 16, and a field discharge resistor 18 which are operably connected to the main DC field winding of the motor 20. A more detailed description of such a device is given in U.S. Pat. No. 3,100,279, Control System For Controlling The Operation of Synchronous Motors which issued on Aug. 6, 1963 to T. G. Rohner.

In many cases, the control circuit components are installed on a mounting ring. The mounting ring is mounted to the motor rotor of the synchronous motor. Therefore, the control circuit components rotate on the rotor and are not accessible during motor operation. Each control circuit is capable of a wide range of rotor speeds over which it will try to lock the rotor onto a fixed speed. However, if the control circuit operates before or after a motor's particular rotor speed, the motor will not lock onto its synchronous speed and it becomes necessary to repair the exciter control circuit.

In the past, the adjustment of the control circuit has been accomplished using a field trial-and-error method, resulting in uncertainty of operation associated with an untested repair and blind adjustment of the control circuit operating point.

It has been determined, in view of the pitfalls of the past trail and error methods, that a much better operation of the motor may be obtained if the mounting ring with the defective control circuits is removed from the motor and replaced with a new mounting ring with an accurately functioning control circuit which has already been accurately bench tested for proper operation or alternatively, removed from the motor, repaired and then reinstalled in the motor. However, the standard mounting ring for the motor is continuously formed (i.e., donut shaped) around the rotor shaft and therefore requires the removal of the end bearing of the motor and other major mechanical work before it can be removed from the shaft of the motor. Thus, the removal of the standard mounting ring and the replacement thereof normally requires at least one work day. This down time of the motor being totally unacceptable, it was necessary to develop a means for quick and easy removal and replacement of the mounting ring.

Previously no device was available to satisfactorily simulate the operation of the motor so that the control circuit on the mounting ring could be tested without attaching the mounting ring to the motor and commencing actual operation thereof.

The present invention overcomes the aforesaid problems and deficiencies associated with the prior art repair methods by providing an easily replaceable sectioned mounting ring, a method of testing and repair and a synch circuit tester which enables adjustment of the synchronous motor exciter control circuit without actual operation of the synchronous motor and also facilitates detection of any malfunctioning components in the synchronous motor exciter control circuit.

SUMMARY OF THE INVENTION

Accordingly, one object of this invention is to provide a novel synch circuit tester which simulates the operation of a synchronous motor.

It is another object of the present invention to provide a novel synch circuit tester which enables all the components of the synchronous motor exciter control circuit to be operationally tested without actual operation of the synchronous motor.

It is still another object of this invention to provide a synch circuit tester which enables the control circuit operating point to be bench tested and adjusted.

It is yet another object of this invention to provide a novel sectioned control circuit mounting ring which facilitates easy removal from and attachment about the rotor shaft of a synchronous motor.

It is still yet another object of the present invention to provide a novel method of repairing a synchronous motor having a defective control circuit mounted on a mounting ring.

Another object of the present invention is to provide a novel method of repairing a synchronous motor which reduces the down time of the motor.

In order to accomplish the aforesaid objectives, a synch circuit tester is provided which provides the normal AC power requirements for obtaining power for the DC field poles and power to operate the control circuit. Further, the device duplicates the power produced from the DC field poles of the synchronous motor before the motor switches from an induction motor to a synchronous motor. The simulation of the aforesaid power sources, enables the operation of the control circuit to be checked. In addition, switches, meters, and lights may be added to the tester to monitor each component's operation.

A sectioned mounting ring is also provided so that the control circuit mounted thereon, may be easily removed from the motor and replaced with another sectioned mounting ring which has a properly functioning control circuit.

BRIEF DESCRIPTION OF THE DRAWINGS

A more complete appreciation of the invention and many of the attendant advantages thereof will be readily obtained as the same becomes better understood by reference to the following detailed description when considered in connection with accompanied drawings, wherein.

DESCRIPTION OF THE PREFERRED EMBODIMENTS

Figure 1:
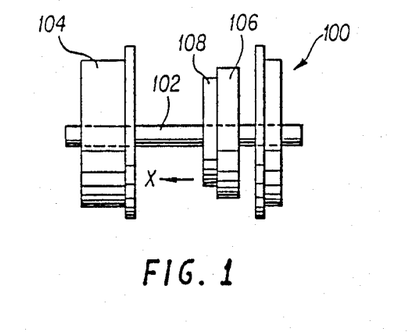
FIG. 1 is a mechanical block diagram of a synchronous motor.
Figure 2:
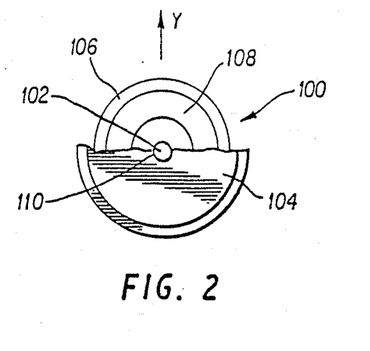
FIG. 2 is a partial end view of the motor of FIG. 1.
Figure 3:
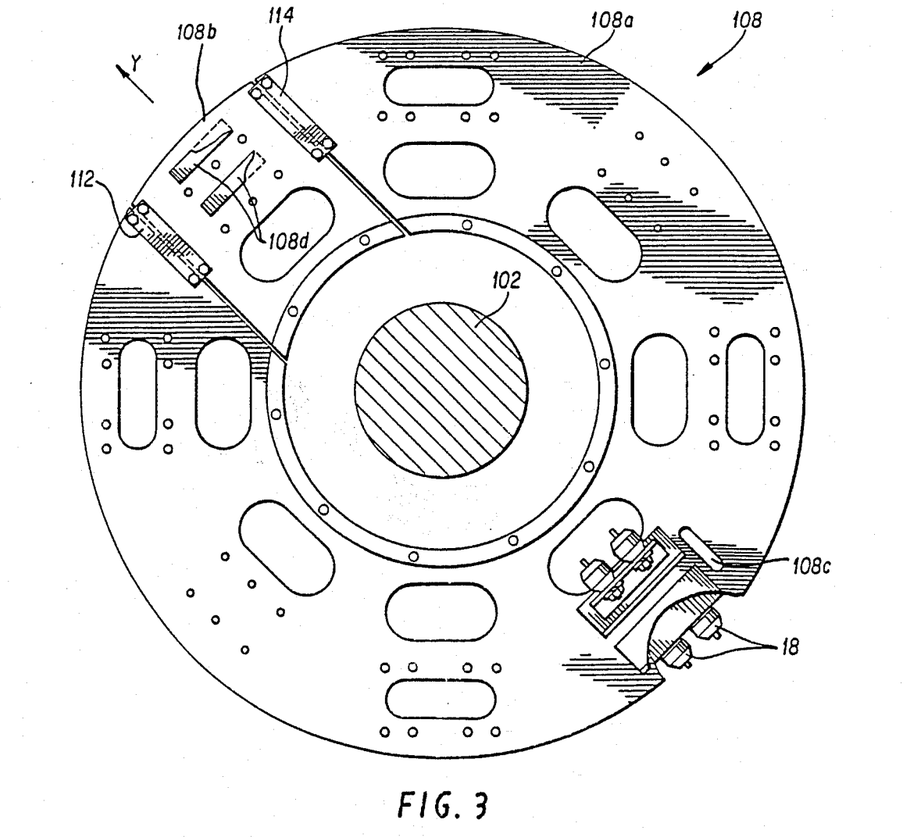
FIG. 3 is a plan view of a mounting ring according to the present invention.

Referring now to the drawings, wherein like reference numerals designate identical corresponding parts throughout the several views, and more particularly to FIGS. 1-3 thereof, the mounting ring of the present invention is illustrated.

FIGS. 1 and 2 illustrate some of the basic components of a synchronous motor. A rotor shaft 102 is supported by one or more bearings 110. The motor rotor 106 is connected to the rotor output shaft 102 causing it to rotate when the motor is energized. A control circuit mounting ring 108 is normally connected to the motor rotor 106 and encircles the rotor output shaft 102. Mounting ring 108 supports the exciter control circuit (shown in FIG. 4) which switches the operation of the motor to synchronous. Therefore, when the control circuit fails, in order to operate the synchronous motor, the mounting ring 108 must be repaired on the motor 106. This approach is time consuming and can result in long repair periods, if parts replacement does not go smoothly. Removal and replacement of the conventional mounting ring 108 is thus particularly undesirable as it requires of the heavy motor components and is thus very time consuming.

The present invention contemplates a new and improved mounting ring 108 as shown in FIG. 3 which includes segmented portions 108a and 108b which are connected together by the connector plates 112 and 114 by way of bolts or other connectors well known in the art. Therefore, if a failure in the control circuit on the mounting ring occurs, the connecting plates 112 and 114 are disconnected from the mounting ring 108 and the segment 108b may first be removed in a radial direction Y from the motor shaft. Then the remaining mounting ring segment 108a may be removed also in the radial direction Y in order to make any necessary repairs or replace the mounting ring 108 with another mounting ring with an accurately functioning control circuit. Thus, the down time of the motor can be significantly reduced due to the ease of replacing the mounting ring 108.

Referring now to FIG. 4, the test device of the present invention is shown connected to a conventional synchronous motor control circuit. In this embodiment the test device is connected to a three-phase power source preferably at 208 volts, with the outputs of the test device 2 connected to the respective inputs of: the three-phase rectifier circuit of the synchronous motor exciter control circuit 6, the cathode of silicon controller rectifier (SCR)8, and nodes A and B. The motor control circuit 4 also includes the SCR 8, connected to its control circuit 10 which is connected to a second SCR 12 which has a respective control circuit 14 and to a diode 16. The control circuit 4 also includes a field discharge resistor circuit 18, the output of the control circuit 4 being connected across the main DC field winding 20 of the synchronous motor. Terminals A and B of the control circuit 4 are connected to respective terminals of the test device 2.

When the ring 108 is segmented attention must be paid to the mounting of the components illustrated schematically in FIG. 4 (particularly the heavier components) to assure that the ring 108 is properly balanced for rotation. referring to FIG. 3, field discharge resistors 18 are relocated from the area of mounting ring segment 108b to a position 180° across the ring from the segment 108b. Further, two pairs of the resistors 18 are located on each face of the ring. This locates all the field discharge resistors in the same general position, half on each face of the mounting ring. The field discharge resistors 18 are connected together with metal straps (not shown) through an aperture 108c cut in the mounting ring 108a. The current carrying conductor (not shown) and the conventional lashing ring (not shown) are removed from the mounting ring segment area 108b. The conductor is routed around the lashing ring in the opposite direction to maintain the necessary circuit connection. The entire assembly is then balanced using weights 108d placed in area of removed field discharge resistors 18.

Figure 5:
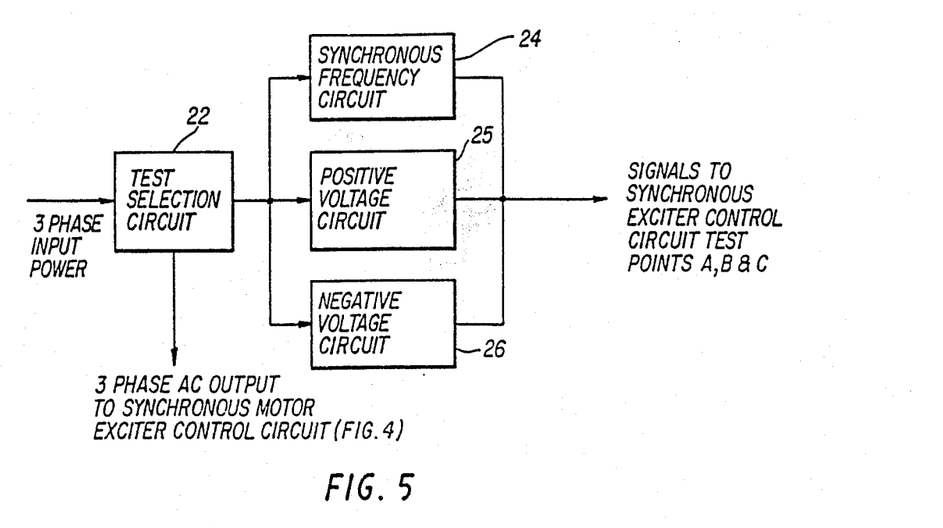
FIG. 5 is a block diagram of the synch circuit tester of the present invention.

Now referring to FIGS. 4 and 5, the block diagram of the present invention will be described. The present invention comprises a test selection circuit portion 22, a synchronization frequency test circuit portion 24, a high positive voltage test circuit portion 25, and a low negative voltage test circuit portion 26. Three-phase power is input to the test selection circuit 22 and when desired can be transferred to the input of the control circuit shown in FIG. 4. The test selection circuit portion 22 may also be used to select the type of test to be performed by the test device 2. If it is desired to determine the frequency which the control circuit of FIG. 4 operates for synchronization of the motor, the test selection circuit 22 is used to select the synchronization frequency test circuit portion 24; and if it is desired to test the operation of the main field start-up power dissipation circuit, then the test selection circuit 22 is used to select the positive or negative synchronous control circuit test portion 25 or 26, respectively.

The test device 2 is used to simulate the operation of the synchronous motor and may apply a three-phase AC voltage to the power input terminals of the exciter control circuit which simulates the three-phase AC generator output from the synchronous motor to the exciter control circuit 4. The test device 2 is also used to vary the AC voltage to terminals B and C of the exciter control circuit 4 to simulate the voltage generated during a normal starting sequence of the synchronous motor. As the voltage is varied, a properly operating control circuit 10 will switch the exciter control circuit DC power through the main DC field silicon controlled rectifier 8. The device 2 simulates normal DC load to the silicon controlled rectifier 8, which allows the monitoring of various devices to detect the instant of operation.

Figure 6:
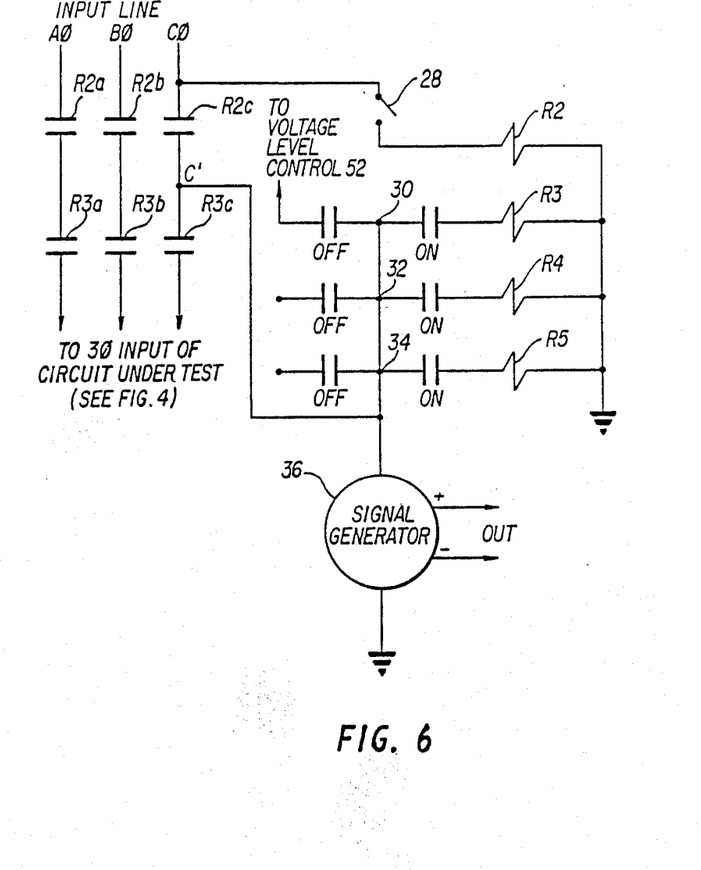
FIG. 6 is a schematic diagram of a portion of the circuit of the present invention.
Figure 7:
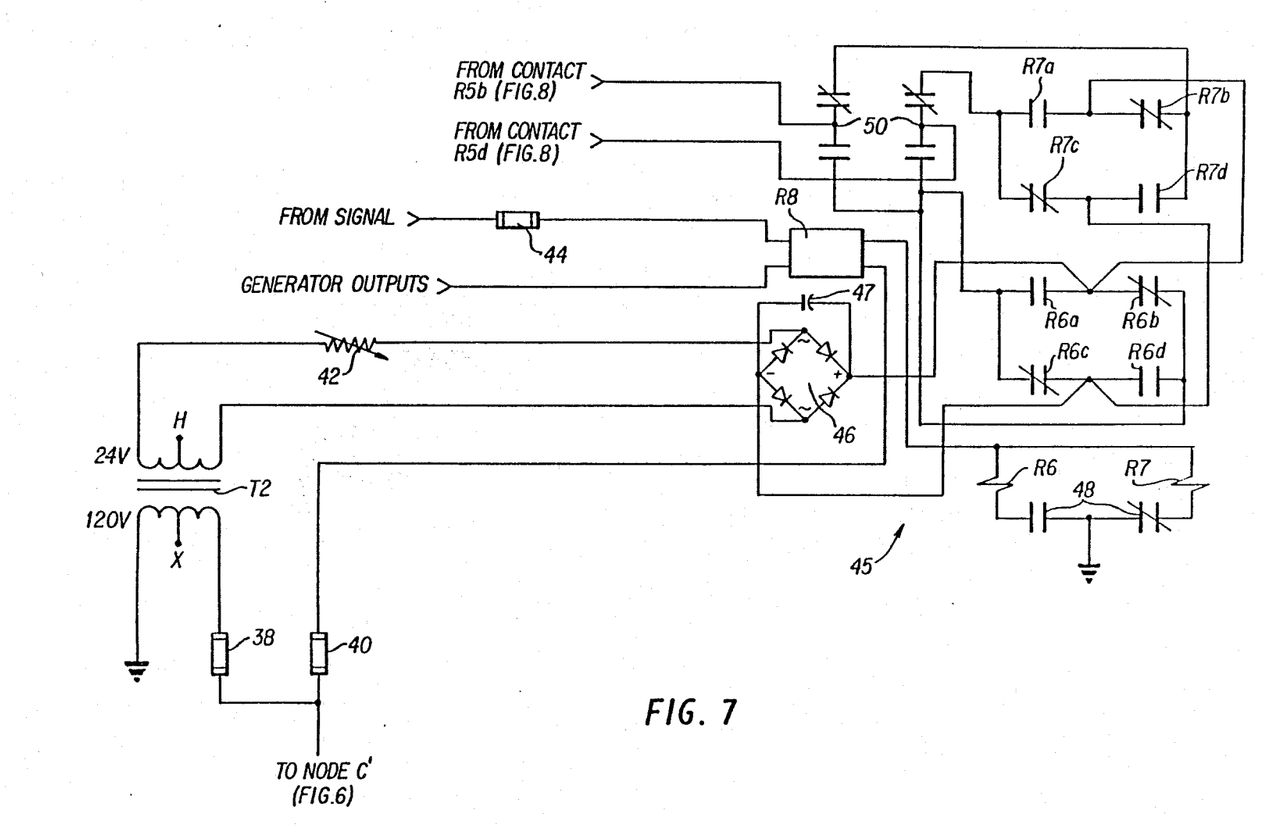
FIG. 7 is a schematic diagram of another portion of the circuit of the present invention.
Figure 8:
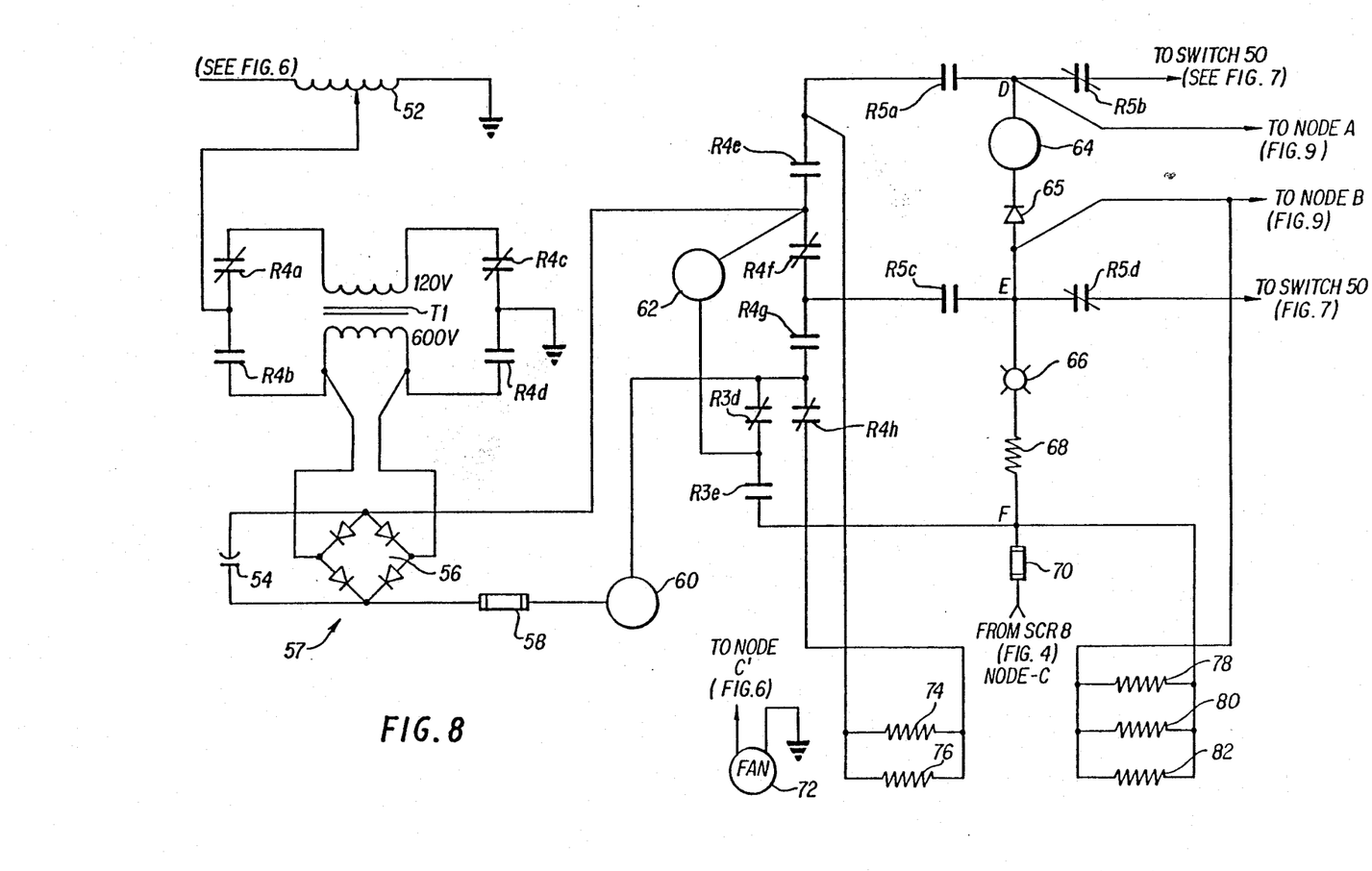
FIG. 8 is a schematic diagram of still another portion of the circuit of the present invention.

Referring now to FIGS. 6, 7 and 8, a detailed description of the circuit of the present invention will be described. Each phase of the three-phase power is input through a respective series pair of relay contact R2C and R3C, R2B and R3B, and R2A and R3A. It should be noted that protective fuses may also be inserted in each input line to protect the device. A power switch 28 is connected in series from the phase C input line to R2. Thus, switch 28 energizes R2, providing power to signal generator 36 and switches 30, 32, and 34. Thus switches 30, 32, and 34 are used to energize the respective relay coils R3, R4 and R5. One circuit of the switch 30 is connected to the voltage level control 52 shown in FIG. 8. One circuit of the switch 34 and a signal generator 36 are connected to the node C' between the relay contacts R2C and R3C. The low voltage transformer T2 (FIG. 7) receives power from node C' (FIG. 6) through a fuse 38. Power is also provided to the relay R8 from node C' through the fuse 40. The low voltage side of the transformer T2 includes a sensitivity level control resistor 42 and is connected to a power supply which comprises a bridge rectifier 46 and filter capacitor 47. The output of the power supply is connected to both the relays R6 and R7 which are controlled by the selector switch 48. An output from either relay R6 or relay R7 may be selected by the selector switch 50. the switch 50, has one contact connected to the contact R5B of the relay R5 and the other contact connected to the relay contact R5D of the relay R5 (FIG. 8). The outputs from the signal generator 36 are connected to the inputs of the relay R8, one side through a fuse 44. The voltage level control 52 (FIG. 8) is connected to the transformer T1 through the contacts R4A and R4B of the relay R4. Each coil of the transformer T1 is connected to a respective relay contact R4C and R4D to ground. The secondary of T1 is connected to a full wave bridge rectifier 57 comprised of the diode bridge 56 and the filter capacitor 54. The meter 60 is connected in the bridge circuit through a fuse 58. The bridge circuit also has one end connected to the volt meter 62 which has its other end connected to the node between the contacts R3D and R3E of the relay R3. One end of the contacts R3E is connected to a parallel combination of resistors 78, 80 and 82 which have their other ends connected to the input from the control circuit (node B, FIG. 9). The parallel resistors 74 and 76 are connected across the relay contacts R4E, R4F, R4G and R4H. The parallel resistors 78, 80, and 82 along with the parallel resistors 74 and 76 represent load resistors for the exciter control circuit FIG. 4 and the DC power supply circuit 57, respectively. A volt meter 64 having one end connected to node D and the other end connected in series with diode 65. The other end of the diode 65 in connected to node E at the junction of the contacts R5C and R5D. Light 66 originates at node E and has the other end connected to a limiting resistor 68 which is connected to node F at the fuse 70, the other end of which receives an input from the silicon controlled rectifier 8 (FIG. 4).

The operation of the aforesaid circuit will now be described in detail hereinafter. When switch 28 is closed power is provided to the relay R2 which closes the contacts R2A, R2B and R2C. Therefore, when the relay R2 is energized power is available to the fan 72 (FIG. 8), the variable frequency signal generator 36, the three-function selection switches 30, 32 and 34, the low voltage transformer T2, and the relay R8. Fan 72 is used to cool the load resistors 74, 76, 78, 80 and 82 and runs continuously. The signal generator 36 such as a B&K Model 3010 function generator is controlled by on-off, function selection, and range selection knobs mounted on its front panel. The output from the signal generator 36 is used to operate R8 so that it can be used to control the switching relay R6 or R7. T2 provides 24 volts AC to the low voltage DC power supply comprised of the bridge rectifier 46 and filter capacitor 47. The low voltage DC positive and negative outputs are connected to both relay R6 and relay R7 contacts so that the signal generator 36 controlled relay R8 can control either the relays R6 and R7 as selected by switch 48. When the voltage is applied to the common terminal of the switch 30, 120 volts AC can be switched to either energize the relay R3 or to energize the voltage level control 52 of the high voltage transformer T1. If voltage is supplied to the relay R3, it operates and provides three-phase voltage to the three exciter output terminals of the test device 2. Relay R3 also disconnects the high voltage DC meter 62 from the circuit. When voltage is supplied to the voltage level control 52, T1 is energized via contacts of the function selection relay R4 which is energized by switch 32. The DC output current from the bridge rectifier 56 is measured by the amp meter 60 and the high voltage DC power supply components are protected by the fuse 58. DC high voltage output is measured by the volt meter 62.

Various tests may be performed by the circuit depending on the position of the selection switches. The first test is used to check the calibration or malfunction of the sync control 10 and the silicon controlled rectifier 8. A second test may be performed to check the forward characteristics of the diode 16, the reverse characteristics of the silicon controlled rectifier 12 and the element value of the field discharge resistors 18. Still another test may be performed to check the malfunction of the control circuit filter 14, the silicon controlled rectifier 12, reverse characteristics of the diode 16 and the connections of the field discharge resistor circuit 18.

In order to determine the frequency at which the synchronous control 10 operates, causing the silicon controlled rectifier 8 to conduct, the power switch 28 must be closed and the switch 30, which energizes the relay R3 must be closed. Therefore, when the silicon controlled rectifier 8 conducts, DC current from the three-phase full wave rectifier 6 of the synchronous motor exciter control circuit assembly 4 will be conducted through the load resistors 78, 80 and 82 via the fuse 70. The indicator light 66 will illuminate when the silicon controlled rectifier 8 conducts.

In order to test the field discharge circuit of the synchronous motor exciter control circuit assembly 4 and more particularly the total circuit resistance value, the switches 28, 32, and 34 must be "on" while switch 30 must be "off". Switch 30 de-energizes the relay R3 which connects the meter 62 back into the circuit and disconnects three-phase power from the synchronous motor exciter control circuit assembly 4; relay R5 is energized by switch 34 and the switching circuit 45 (of FIG. 7) is removed from the circuit, while the node A and node B are connected to the variable power supply 57; and when the relay R4 is energized by switch 32, positive DC is applied to the node E via the contacts R4G and R5C and negative DC is applied to the node D via the contacts R4E and R5A, while 120 volts AC is applied directly to the diode bridge 56 via contact R4B and R4D and 120 volts AC is isolated from the primary of the transformer T1 by contacts R4A and R4C.

Finally, to test the operation of the SCR 12, switches 30 and 32 are in the "off" position and, the switches 34 and 28 are in the "on" position. The switch 30 provides power to the voltage level controller 52. The switch 32 de-energizes the relay R4 allowing: the output from the voltage level controller 52 to be applied to the primary of the transformer T1 via contacts R4A and R4C, the parallel resistors 74 and 76 are serially connected with the positive DC source via contacts R4H on one end and to the contacts R5A on the other end, negative DC is brought to the contact R5C via contacts R4F, and the secondary of the transformer T1 is isolated from the primary of the transformer T1 with contacts R4B and R4D. The switch 34 energizes the relay R5 and the switching circuit 45 is removed from the circuit with contacts R5B and R5D, node A is connected to the positive DC high voltage through the contacts R5A, node B is connected to the negative DC high voltage through the contacts R5C. The diode 65 prevents the meter 64 from reading reverse polarity high voltage.

It should also be noted that additional light sources could be added across the three-phase power lines after the contacts R2A, R2B and R2C and also after the contacts R3A, R3B, and R3C in order to monitor the quality of power.

Figure 9:
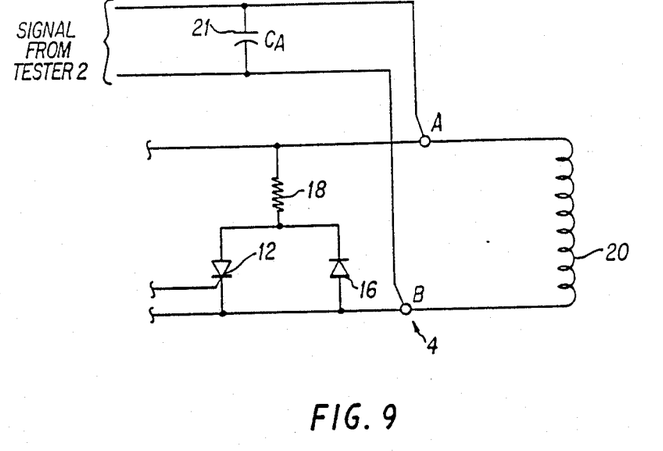
FIG. 9 is a partial schematic diagram of an alternate embodiment of the Sync circuit tester of the present invention.

Referring now to FIG. 9, an alternate embodiment of the synch circuit tester is illustrated. In the first embodiment, the silicon controlled rectifier 8 lead is disconnected from the exciter control circuit because the source which is generating the variable frequency is limited in power output. The main motor field has low resistance but due to the great number of windings, has a high inductive reactance. Therefore, the step of disconnecting one motor field lead and the cathode of the silicon control rectifier 8 is eliminated by connecting an inductive reactance cancelling capacitor 21 across the A and B terminals of the control circuit 4.

Figure 10:
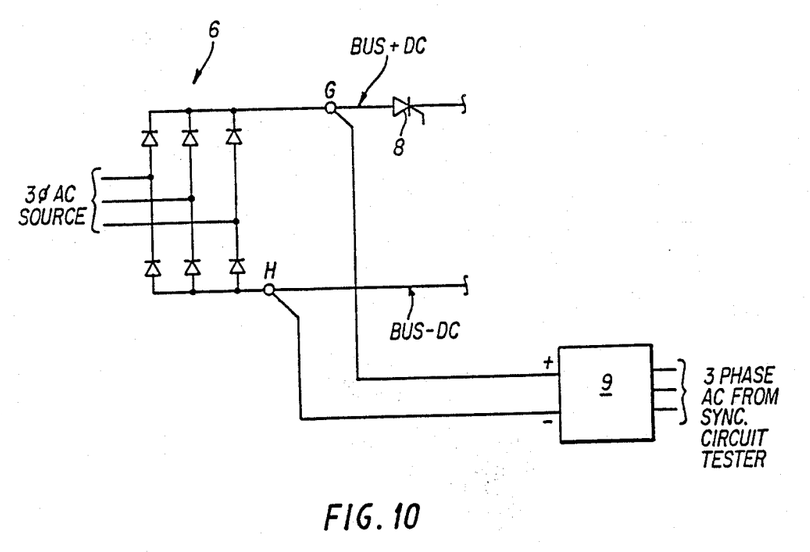
FIG. 10 is a partial schematic diagram of an alternate embodiment of the synch circuit tester of the present invention.

Referring now to FIG. 10, a variable high voltage DC power supply 9 may be added to the synch control tester. In the first embodiment, the threephase AC source is isolated from the test circuit by removing two of the leads. This is necessary because of the high AC current drawing by the circuit at rated conditions. However, to avoid the necessity of removing two of the leads, the tester can generate a DC voltage which is applied to the positive and negative DC bus of the exciter control circuit 4 which approximates design conditions. Thus, the variable high voltage DC power supply 9 is added to the synch control circuit tester. This also enables the variety of exciter control circuits to which the tester can be used to be expanded. Consequently, if the DC power supply diodes are all working, then the reverse current draw will be very small, while the voltage drop across the diodes can be measured and the reverse resistance can be checked.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of repairing a synchronous motor having a mounting ring with an exciter control circuit thereon, said mounting ring encircling the rotor shaft of said motor, and comprising the steps of:
   sectioning said mounting ring into at least first and second removably connected portions;
   removing said first portion in a radial direction from said rotor shaft;
   removing the second portion of said mounting ring in a radial direction from said rotor shaft;
   checking the operation of said exciter control circuit and making repairs and adjustments thereto, if necessary; and
   replacing said first and second portions, in a radial direction towards said rotor shaft, into their respective operating positions.

2. A method according to claim 1, wherein said fourth step further comprises:
   connecting said control circuit to an exciter control circuit tester; and
   simulating the operation of said synchronous motor.

3. A method, according to claim 2, wherein said step of simulating the operation of said synchronous motor further comprises the steps of:
   simulating the load on the exciter components of said synchronous motor and varying the frequency of a signal from said exciter control circuit tester to said exciter control circuit.

4. A method, according to claim 3, wherein said step of simulating the operation of said synchronous motor further comprises the steps of:
   determining the response of said exciter control circuit to positive and negative voltages.

5. A method of repairing a synchronous motor having a mounting ring with an exciter control circuit thereon, said mounting ring encircling the rotor shaft of said motor comprising the steps of:
   sectioning said mounting ring into at least first and second removably connected portions;
   removing said first portion in a radial direction from said rotor shaft;
   removing said second portion of said mounting ring in a radial direction from said rotor shaft;
   installing at least first and second portions of a different mounting ring with an accurately functioning control circuit in sail motor about said rotor shaft.

* * * * *